United States Patent
Lin

(10) Patent No.: US 7,071,011 B2
(45) Date of Patent: Jul. 4, 2006

(54) METHOD OF DEFECT REVIEW

(75) Inventor: Long-Hui Lin, Hsin-Chu Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 21 days.

(21) Appl. No.: 10/707,824

(22) Filed: Jan. 15, 2004

(65) Prior Publication Data

US 2005/0159909 A1 Jul. 21, 2005

(51) Int. Cl.
*H01L 21/00* (2006.01)
(52) U.S. Cl. .................. 438/5; 257/E21.521; 438/14
(58) Field of Classification Search .................. 438/5, 438/14; 257/E21.521
See application file for complete search history.

(56) References Cited

U.S. PATENT DOCUMENTS 6,445,199 B1 * 9/2002 Satya et al. .................. 324/753

* cited by examiner

*Primary Examiner*—W. David Coleman
(74) *Attorney, Agent, or Firm*—Winston Hsu

(57) ABSTRACT

A method of defect review. First, a wafer with a plurality of defects is provided. A defect inspection is performed to detect the defects. An automatic defect classification is then performed to divide the defects into different defect types according to a predetermined database. A defect review is performed to review different defect types of defects which are sampled in different weights according to yield killing ratios of each defect types.

9 Claims, 3 Drawing Sheets

METHOD OF DEFECT REVIEW

BACKGROUND OF INVENTION

1. Field of the Invention

The present invention relates to a method of defect review, and more particularly, to a method of defect review using different sampling ratios according to defect types.

2. Description of the Prior Art

In the semiconductor fabricating process, some small particles and defects are unavoidable. As the size of devices shrinks and the integration of circuits increases gradually, those small particles or defects affect the property of the integrated circuits more seriously. For improving the reliability of semiconductor devices, a plurality of tests are performed continuously to find the root cause of the defects or particles. Then, process parameters can be tuned correspondingly to reduce a presence of defects or particles so as to improve the yield and reliability of the semiconductor fabricating process.

Please refer to FIG. 1, which is a schematic diagram of a method of defect detection 10 according to the prior art. As shown in FIG. 1, a sampling 12 is first performed to select a semiconductor wafer as a sample for following defect detection and analysis in advance. Then, a defect inspection 14 is performed. Normally, a proper defect inspection machine is utilized to scan in a large scale to detect all defects on the semiconductor wafer. Since there are too many defects on a semiconductor wafer, a manual defect review with the SEM cannot be directly performed for all defects in practice. A manual defect classification 16 is typically performed before the defect review 18. After separating the defects into different defect types, some defects are sampled for the defect review 18. Then, a defect root cause analysis may be performed in advance according to the result of the defect review 18 to attempt to reduce the defect generation.

In the prior art technology, there is a serious problem of selecting samples. Typically, there are thousands of defects found in the defect inspection 14. However, engineers can only pick a part of them, such as 50 to 100 defects, to perform the defect review 18 and the following defect analysis. The defect sample selection is totally dependent on the personal experience of the engineers. In other words, only a few skilled engineers can pick up some outstanding defects to perform following analysis works by their own experiences. Most operators can only pick up samples randomly for the defect review 18. However, among all defects, most of them are the underlayer defects, which are not related with the current fabricating processes, or some non-killer defects, which have no influence on the yield of fabricating processes. The killer defects, which have a large influence on the yield of fabricating processes, are relatively fewer. Thus, in most cases, since the samples in the defect review 18 are picked up randomly, it is obvious that only a few effective samples are valid and most parts of the defect review 18 are meaningless. This leads to a huge waste of time and effort, deteriorating the accuracy of the following defect analysis.

In the prior art technology, the only way for increasing the accuracy of the defect analysis is by increasing the numbers of samples in the defect review 18 significantly. In other words, a heavy loading and a significantly additional time are unavoidable, leading to a testing time delay and even a serious throughput reduction during the mass production.

With the progression of the semiconductor technology, the size of wafers increases from 8 inches to 12 inches and the line width reduces from 0.18 μm to 0.13 μm and even below 0.1 μm. In the process from testing into the mass production, defects occur very often and are unavoidable. In other words, the defect detection and analysis become more and more important. Thus, a quick and efficient method of defect review is strongly needed to solve the aforementioned problems.

SUMMARY OF INVENTION

It is therefore a primary objective of the claimed invention to provide an efficient method of defect review to solve the aforementioned problems in the prior art.

In a preferred embodiment of the claimed invention, a method of defect review is disclosed. First, a wafer with a plurality of defects is provided. Then, a defect inspection is performed to detect the defects on the wafer. An automatic defect classification is performed according to a predetermined database. After filtering out the defect types belonging to the underlayer defects, the residual defect types, which belong to the adding defects, are further separated into a plurality of defect types. A defect review is then performed wherein each defect type has different sampling ratios in the defect review according to its influence degree of process yield to improve the efficiency of the defect review.

It is an advantage of the claimed invention that the method of defect review of the present invention uses a predetermined database to perform an automatic defect classification. Thus, the underlayer defects, non-killer defects, and the killer defects can be separated and a high sampling ratio of the killer defects can be used in the defect review and further analysis. It can further reduce the loading of the defect review, shorten the response time, and improve the sensitivity of the defect detection, thereby improving yield and reliability of products.

These and other objectives of the claimed invention will no doubt become obvious to those of ordinary skill in the art after reading the following detailed description of the preferred embodiment which is illustrated in the various figures and drawings.

DETAILED DESCRIPTION

Figure 1:
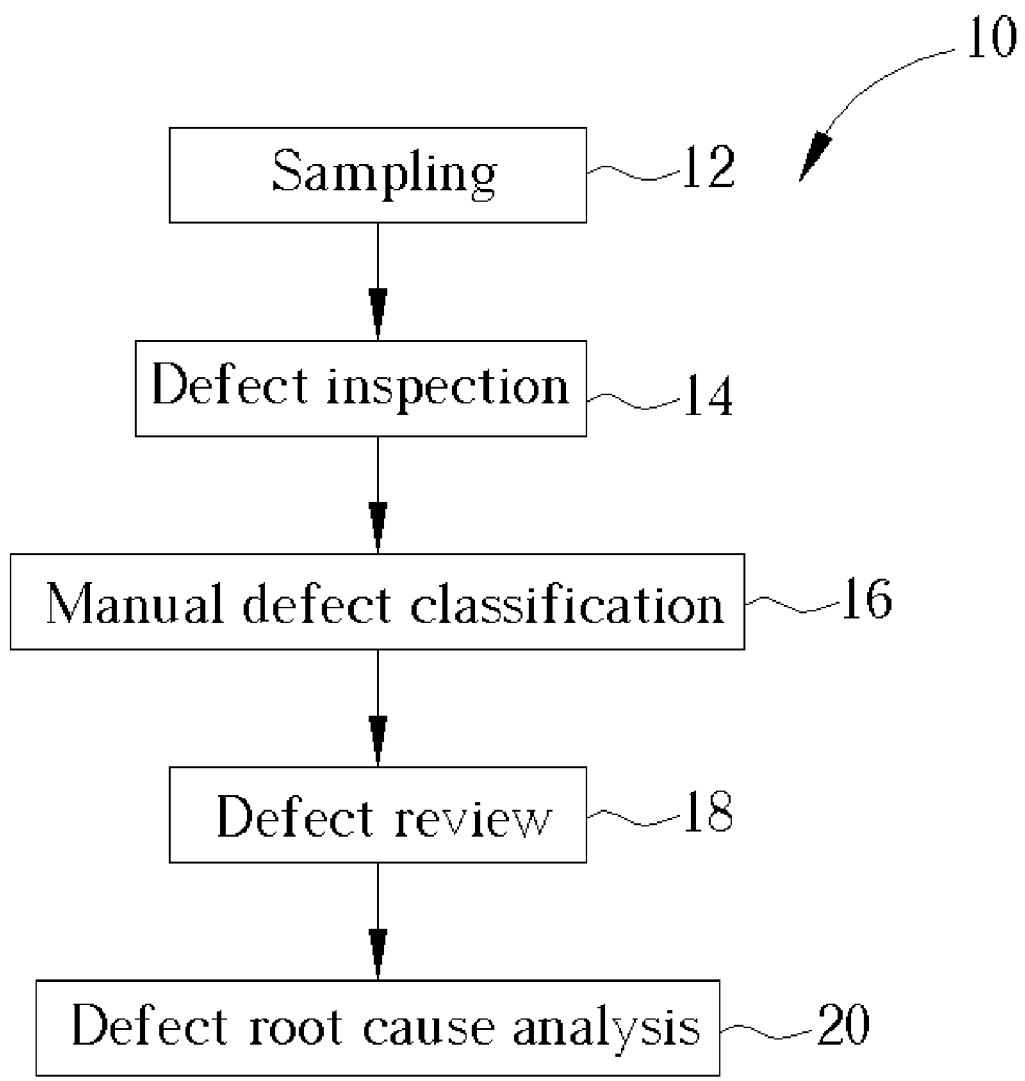
FIG. 1 is a schematic diagram of a conventional method of defect review according to the prior art.
Figure 2:
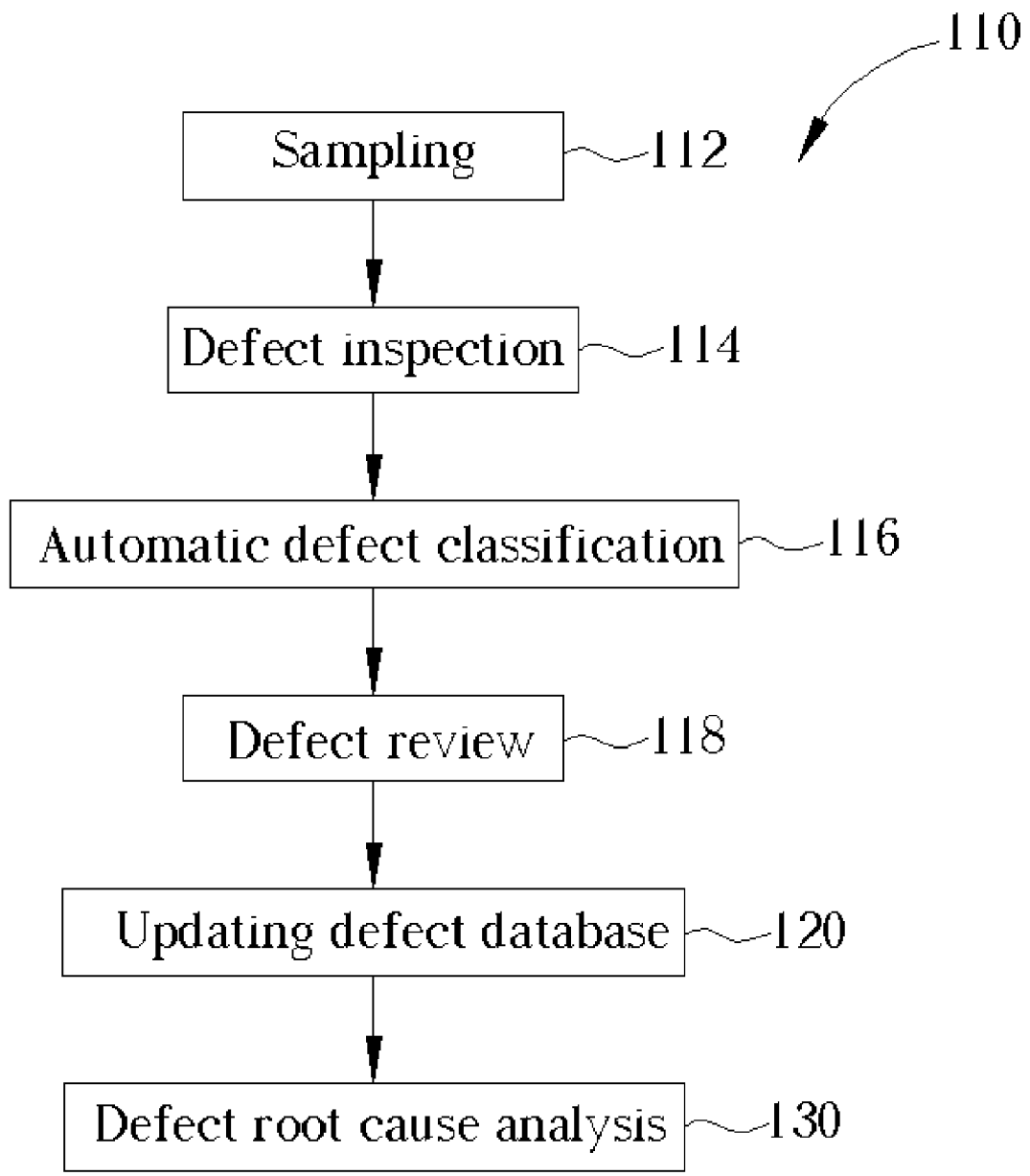
FIG. 2 is a schematic diagram of a method of defect review according to the present invention.

Please refer to FIG. 2, which is a schematic diagram of a method of defect review 110 according to the present invention. As shown in FIG. 2, first, a predetermined semiconductor process is selected as the target of the defect detection and analysis. Then, a sampling 112 is performed to pick up one semiconductor wafer from a plurality of wafers that have experienced the predetermined semiconductor process. A defect inspection 114 is followed to scan the semiconductor wafer in a large scale to detect the sizes, shapes, and locations of the defects. An automatic defect classification (ADC) 116 is performed according to a predetermined defect database to separate the defects into a plurality of defect types. In the preferred embodiment of the present invention, the defect database includes information about the plurality of defect types and the defect information corresponding to each defect type. Thus, an ADC tool can utilize the defect database to separate the defects into different types according to some factors stored in the defect database, such as sizes, shapes, or locations, and the numbers of each defect type is counted at the same time.

Figure 3:
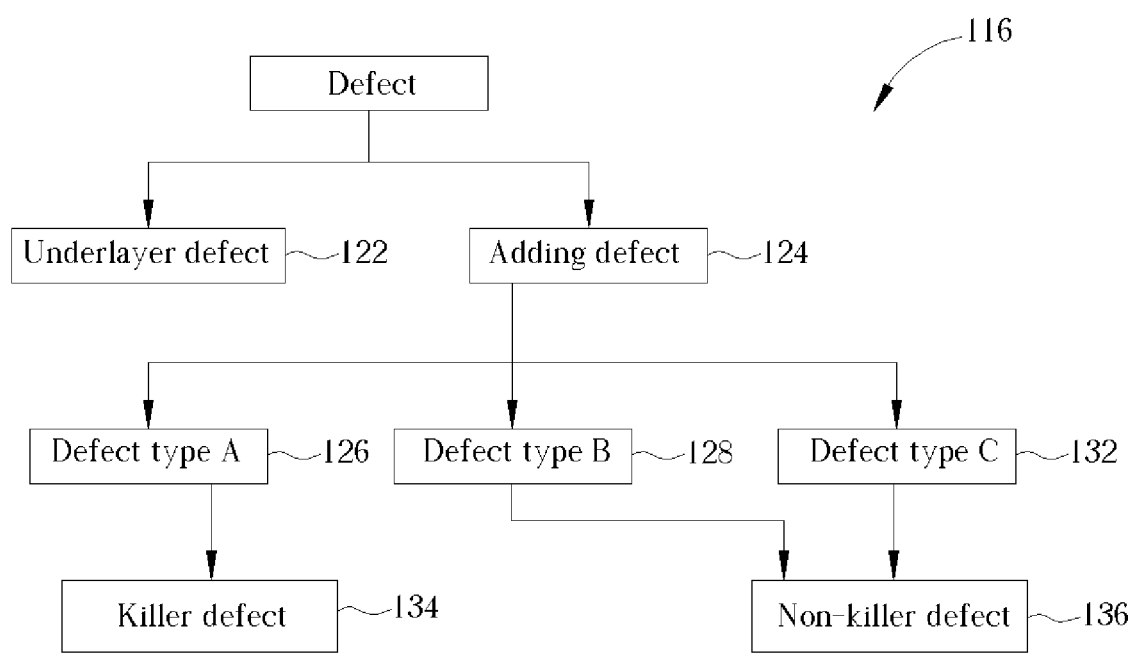
FIG. 3 is a schematic diagram of defect classification.

Please refer to FIG. 3, which is a schematic diagram of the automatic defect classification 116 in the present invention. As shown in FIG. 3, after the defects are detected in the defect inspection 114, the defects are first divided into two groups, which are underlayer defects 122 and adding defects 124 according to the information stored in the defect database. It is noted that the underlayer defects 122 come from some previous fabricating processes and only the adding defects 124 are caused by the concerned fabricating process, which is chosen at first. Thus, the ADC tool will filter out the underlayer defects 122 and perform an advanced defect classification for the adding defects 124.

In the preferred embodiment of the present invention, the defect database comprises classification information to let the ADC tool separate the adding defects 124 into different defect types, such as a defect type A 126, a defect type B 128, and a defect type C 132 illustrated in FIG. 3, according to some factors such as sizes, shapes, and locations. The amounts of each defect type are counted to assist an engineer in obtaining more information about the defects on this semiconductor wafer. It is noted that the defect information in the defect database further comprises the influence degree of the process yield of each defect type and each defect type of the adding defects 124 are further divided into two groups, which are killer defects 134 and non-killer defects 136 according to the influence degree of the process yield.

Then, some defect samples of each defect types are sampled to perform the defect review 118. It is important that the sampling ratio of each defect type in the defect review 118 is set according to its influence degree of process yield. For example, since the defect type A 126 belongs to killer defects 134 and the defect type B 128 and the defect type C 132 belong to the non-killer defects 136, the sampling of the defect review 118 mainly focuses on the defect type A 126. For example, it may pick up 80 samples from the defect type A 126, 10 samples from the defect type B 128, and 10 samples from the defect type C 132. Thus, the efficiency of the defect review 118 can be improved and the accuracy of the following defect root cause analysis 130 can be improved thereby.

To distinguish the difference between the method of the present invention and that of the prior art, an example is used to illustrate. It is supposed that there are 2000 defects in a semiconductor wafer and those defects are composed of 1000 underlayer defects, 900 small particle defects, and 100 large particle defects. According to the prior art method with random sampling, it typically obtains 50 underlayer defects, 45 small particle defects, and 5 large particle defects.

However, according to the method of defect review of the present invention, those defects are classified according to the influence degree of process yield of each defect type at first. If the fabricating process, which is predetermined to be examined, is a front end process, all sizes of defects except the underlayer defects are treated as killer defects since all sizes of defects will grow in following deposition processes. Thus, the sampling of the defect review 118 can be randomly spread into the small particle defects and the large particle defects. In other words, the sampling is typically corresponding to the amount of each defect type. For example, a sampling composed of 90 small particle defects and 10 large particle defects is a reasonable choice to perform the defect review 118. However, if the predetermined fabricating process is a back end process, only the large particle defects are treated as killer defects instead of the large particle defects and the small particle defects in a front end process. In this case, since only the large particle defects are killer defects, the sampling ratio of the large particle defects should be raised significantly, such as a sampling composed of 90 large particle defects and 10 small particle defects for the defect review 118. In comparison with random sampling method in the prior art in which a sampling of 50 underlayer defects, 45 small particle defects, and 5 large particle defect may be used, it is obvious that the sampling method of the present invention can obtain a better result in the defect review, leading to a relatively accurate result of the following defect root cause analysis.

In addition, though the sampling ratio of the defect review 118 is dependent on a predetermined defect database and a result of the automatic defect classification 116, the data in the defect database is not unchangeable but can be updated according to the result of the defect review 118. For example, according to an obtained result of the defect review 118, the defect type 128 may be regrouped to the killer defect 134 or a new defect type D may be added into the defect types in the defect database. Then, the automatic defect classification 116 and the defect review 118 can be reworked to get an optimized result for improving the sensitivity and accuracy of the defect root cause analysis 130.

Besides performing the defect review 118 with a sampling ratio according to the influence degree of process yield of each defect type, engineers can also manually adjust the sampling ratios according to any special features or excursion cases observed in the defect inspection 114. For example, it is often found that there are some cluster defects in a corner of the semiconductor wafer. Engineers can perform the defect review 118 with a high sampling ratio of those cluster defects to analyze these excursion cases in advance.

In contrast to the prior art, the method of defect review in the present invention increases the sampling ratios of the killer defects or some excursion cases, and a defect review with more efficiency can be obtained thereby. In other words, with the same amounts of defect review, the method of defect review of the present invention can obtain a more accurate result of the defect review and can obtain more meaningful data for following defect root cause analysis, leading to a more correct result of the defect root cause analysis. Relatively, if the convention method attempts to obtain the same result in comparison with the present invention, more effort and time must be paid obviously. In other words, the present invention can improve the efficiency and the accuracy of the defect detection so as to meet the requirement of inline test and the mass production to adjust process parameters in a relatively short time for improving the throughput and the reliability of products.

Those skilled in the art will readily observe that numerous modifications and alterations of the device may be made while retaining the teaching of the invention. Accordingly, the above disclosure should be construed as limited only by the metes and bounds of the appended claims.

The invention claimed is:
1. A method of defect review comprising following steps:
providing a wafer with a plurality of defects;
performing a defect inspection to detect the defects;
performing an automatic defect classification according to a database to separate the defects into a plurality of defect types;

adjusting sampling ratios according to an influence degree each defect type has on process yield; and performing a defect review using the adjusted sampling ratios.

2. The method of claim 1 wherein the database comprises information about the plurality of defect types and defect information corresponding to each defect type.

3. The method of claim 2 wherein the defect information comprises the influence degree of the process yield of each defect type.

4. The method of claim 3 wherein the database separates the defect types into killer defects and non-killer defects according to the influence degree of the process yield.

5. The method of claim 4 wherein the sampling ratio of the killer defects in the defect review is larger than that of the non-killer defects.

6. The method of claim 3 wherein the database separates the defects into pre-layer defects and adding defects, and further separates the adding defects into killer defects and non-killer defects.

7. The method of claim 6 wherein the defect review focuses on the adding defects.

8. The method of claim 1 wherein after finishing the defect inspection, a judgment of cluster defects is performed and a defect review with a high sampling ratio is performed on the cluster defects if the cluster defects exist.

9. The method of claim 1 wherein the database is updated according to the result of the defect review after finishing the defect review.

* * * * *